United States Patent
Görtler et al.

(10) Patent No.: US 7,518,363 B2
(45) Date of Patent: Apr. 14, 2009

(54) DEVICE FOR CALIBRATING A MAGNETIC RESONANCE APPARATUS HAVING A PET FUNCTION

(75) Inventors: Georg Görtler, Balersdorf (DE); Sebastian Görtler, Erlangen (DE); Rainer Kuth, Höchstadt (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/889,255

(22) Filed: Aug. 10, 2007

(65) Prior Publication Data

US 2008/0036459 A1 Feb. 14, 2008

(30) Foreign Application Priority Data

Aug. 11, 2006 (DE) .................. 10 2006 037 776

(51) Int. Cl.
*G01V 3/00* (2006.01)
(52) U.S. Cl. ................................ 324/307; 324/309
(58) Field of Classification Search ......... 324/300–322; 378/207; 600/407–445
See application file for complete search history.

(56) References Cited

U.S. PATENT DOCUMENTS

| 6,333,971 B2 * | 12/2001 | McCrory et al. ............. 378/162 |
| 7,056,019 B1 * | 6/2006 | Hanson et al. ............. 378/207 |
| 2007/0100225 A1 * | 5/2007 | Maschke .................... 600/407 |

FOREIGN PATENT DOCUMENTS

| EP | 1 413 251 | 4/2004 |
| WO | WO 03/025621 | 3/2003 |

OTHER PUBLICATIONS

Applicant erncloses a German Office Action issued Mar. 6, 2007.

* cited by examiner

*Primary Examiner*—Brij B Shrivastav
(74) *Attorney, Agent, or Firm*—Harness, Dickey & Pierce, P.L.C.

(57) ABSTRACT

A device is disclosed for calibrating a magnetic resonance apparatus having a PET function. In at least one embodiment, the device includes at least one marker that is visible through magnetic resonance imaging and fixed with reference to the device; at least one holder, fixed with reference to the marker, for a receptacle for holding a PET tracer generating a PET signal during PET imaging; and at least one receptacle for holding a PET tracer.

20 Claims, 6 Drawing Sheets

DEVICE FOR CALIBRATING A MAGNETIC RESONANCE APPARATUS HAVING A PET FUNCTION

PRIORITY STATEMENT

The present application hereby claims priority under 35 U.S.C. §119 on German patent application number DE 10 2006 037 776.1 filed Aug. 11, 2006, the entire contents of which is hereby incorporated herein by reference.

FIELD

Embodiments of the invention generally relate to a device for calibrating a magnetic resonance apparatus having a PET function.

BACKGROUND

Both magnetic resonance tomography (MRT) and positron emission tomography (PET) are imaging methods that are suitable for displaying the interior of the human body and, in particular PET, for displaying biochemical processes. There has recently been an interest in combining MRT and PET with one another in a unit in order to be able to apply both imaging modalities simultaneously or shortly after one another to the same patient.

It is proposed to this end to additionally provide a possibly removable PET detector inside the magnet arrangement of basic field magnet and gradient coils customary in a magnetic resonance apparatus. A radio frequency coil arrangement is to be arranged coaxially for the MRT images inside this PET detector arrangement, which is mostly surrounded by a radio frequency shield.

The coordinate system in which the pictures are produced during magnetic resonance imaging is determined by the gradient system of the magnetic resonance apparatus. It is possible in this case to superpose on the flux generating gradient currents an offset that linearly displaces the coordinate system. In addition, modern magnetic resonance apparatuses mostly comprise so-called shim coils or other shim device(s) that superpose on the static magnetic field a small regulatable magnetic field, and thus specifically compensate distorting influences of interference fields of the magnetic resonance apparatus itself or of the environment. The coordinate system of the magnetic resonance scanner is additionally displaced by this additional magnetic field.

To calibrate the scanner or to undertake a later checking of the coordinate system for the magnetic resonance imaging, use is made of so-called magnetic resonance phantoms that include visible markers at predetermined points in the magnetic resonance imaging and are, for example, filled with a substance that forms a visible marker in the magnetic resonance imaging, in particular water. It is also possible to provide an extended marker that is provided in a specific form and with the aid of which calibration is possible. The markers are consequently filled with materials whose magnetic resonance echo time is preferably close to that of biological tissue.

In order to be able to intercompare images of MRT and PET, it is necessary to know the transformation between the measurement coordinate systems of the two imaging systems. There is likewise a need to check this transformation regularly, for example when shim currents are being adapted or the offset is displaced in another way. It is problematic here that the markers of the magnetic resonance phantoms are not visible in the PET imaging, that is to say no PET signal is generated.

There is thus a need for a device and a method that enable the calibration of a magnetic resonance apparatus having a PET function, particularly with regard to the relationship between the measurement coordinate systems of the PET and the MRT.

SUMMARY

In at least one embodiment of the present invention, a device is disclosed that easily enables calibration of a magnetic resonance apparatus having a PET function.

In at least one embodiment of the invention, a device for calibrating a magnetic resonance apparatus having a PET function, comprises at least one marker that is visible through magnetic resonance imaging and fixed with reference to the device, at least one holder, fixed with reference to the marker, for a receptacle for holding a PET tracer generating a PET signal during PET imaging, and at least one receptacle for holding a PET tracer.

The inventive device of at least one embodiment therefore comprises both at least a marker that is visible by way of magnetic resonance imaging, and the possibility of applying at least one marker visible via PET imaging, a PET tracer. That the PET tracer has a decay time in the region of a few hours is taken into account by the easily removable receptacles for the PET tracer and the correspondingly configured holders. In the case of permanent integration of the PET tracer in the structure of the device, this would lead to problems.

It is relevant in this case that the geometric relationships, particularly the position of the individual markers in relation to one another, are known in advance. At the start of a calibration or check, the PET tracer is introduced into the receptacle or the receptacles, and these are inserted into the holders arranged in a fixed fashion with reference to the markers visible through magnetic resonance imaging. Unless already located in the magnetic resonance apparatus, the device is then introduced therein, whereupon simultaneous magnetic resonance and PET image data records are recorded, for example. The position and, if appropriate, the orientation of the marker and the tracer can be determined in these image data records, whereupon it is possible to establish the relationship of the coordinate systems of the image data records with the aid of the known relative spatial arrangement of the marker and the PET tracer.

In this case, it is necessary in particular to bear in mind the abovementioned decay time of the PET tracer, within which it can be used. Consequently, the receptacles should be appropriately configured so as to enable the PET tracer to be filled easily and quickly, and so that the receptacles can easily be placed in the holders.

The holders are configured in this case such that the receptacles are held in as stationary a fashion as possible such that the position relative to the markers remains fixed and known.

The inventive device of at least one embodiment therefore furnishes an easy to use and practicable solution for calibrating a magnetic resonance apparatus having a PET function, it being necessary in the case of the device only to introduce the PET tracer into the receptacles and then to mount the latter appropriately on the holders in order to undertake the required measurements. It is also possible to check conveniently a relationship already found between the measurement coordinate systems, that is to say a transformation already existing.

In this case, one or more markers that are visible in the magnetic resonance image data record can be present. However, a configuration is frequently selected in which a position can already be determined with the aid of a marker, for example an ellipsoidal shape that is filled with water. There is no problem in such a marker remaining on or in the device since—by contrast with the PET tracer—no decay is to be feared here.

Two or more, in particular identically configured holders and receptacles can expediently be provided. The larger the number of the holders present and of the associated receptacles, the more accurate is the information that can be gathered from the appropriate PET image data record. Owing to the identical configuration of the holders and the receptacles, it is possible, finally, to insert a receptacle into any desired holder without there being a need for a specific assignment here. Again, filling the receptacles is the same for all the receptacles, the overall result being a simpler manipulability.

If only one receptacle, which is placed on the device, is provided, it can, for example, be used to establish offset effects such as the shim or gradient coil effects mentioned at the beginning. Such an arrangement is particularly sensible when only checking is to be done, that is to say it is only to be established whether, for example, an offset already known has changed.

If two receptacles having a PET tracer that are placed in appropriate holders are used, it is also possible to correct slice effects in addition to the offset effects.

If three receptacles having a PET tracer are introduced into three appropriately designed holders, it is possible to tune accurately in three dimensions. A perfect transformation of the coordinate systems can be determined in this case, particularly when the MR marker is also appropriately designed.

However, it is also conceivable to use a yet larger number of receptacles, having a PET tracer, and holders. If the PET tracer is, for example, introduced at six positions, distortions can also additionally be corrected during the transformation. Here, distortions mean local length deviations in the three spatial directions. In addition, such an arrangement can be used to check whether PET and MRT measure to the same scale. If an appropriate arithmetic is applied, particularly taking account of the distances, a distortion can also be measured with three positions at which PET tracer is introduced into receptacles. However, it proves simpler to use six positions, it also being conceivable to position eight receptacles in appropriate holders. The corners of a cube, for example, can be selected for this purpose.

As already mentioned, various configurations of the holders and the respective receptacles are conceivable. What is decisive here is to enable the PET tracer to be filled into the receptacle as quickly and simply as possible and without complication, and to be inserted into the holders similarly. There is then no problem in making use for calibration of the tracer which decays within a few hours.

It can particularly be provided to this end that the holder comprises, in at least one embodiment, a depression on the device in which the receptacle is held, in particular by being plugged or clamped. This depression may expediently be of the type of a blind hole. In the case of such a depression, in particular one of the type of a blind hole, a configuration is conceivable in which no further holder elements are required. All that are present are the depressions into which the receptacle is inserted, for example in a lightly clamped fashion. It is thereby possible without any problem to remove and insert the receptacle in a simple way.

Several possibilities are conceivable for the particular configuration of the receptacle.

In a first embodiment of the present invention, it is provided that the receptacle comprises a housing that is filled at least partially with liquid absorbing material. Thus, for example, a cap type housing can be provided in whose region averted from the opening a liquid absorbing material, in particular cotton wool, is provided. The housing can then advantageously be designed such that it can, for example, easily be mounted on a bottle containing the PET tracer, or another vessel, it being possible to introduce the tracer into the liquid absorbing material by appropriately moving the vessel containing the PET tracer.

of course, it is also possible to introduce the PET tracer into the material via a pipette, syringe or the like. The housing, which is designed as a cap, in particular, can then be inserted into the holder, in particular the depression, without any problem. In this configuration, there is no need to fear PET tracer dropping out. Nevertheless, the position of the PET tracer is accurately known such that the calibration and/or checking can be undertaken. This embodiment is useful, in particular, whenever the PET tracer is supplied in a bottle that has a pump system similar to nose spray bottles and a syringe or a ball pump.

In an alternative embodiment, the receptacle can comprise a tubular section that is suitable, in particular, for connecting to a vessel containing the PET tracer and has a valve arranged therein. The receptacle, which, in turn, is particularly suitable for connecting to a vessel containing the PET tracer, can easily be filled with the PET tracer through the tubular section, the valve preventing a backflow of the PET tracer. The receptacle can expediently comprise a balloon type, elastic chamber that is adjacent to the tubular section and is designed to enlarge its volume upon the introduction of PET tracer via the tubular section.

The PET tracer is guided in this case through the tubular section into the balloon type elastic chamber, which slowly fills up by receiving the PET tracer. The valve prevents a backflow. A cap in which a tubular section, surrounded in the manner of a drop by a rubber material, opens into the elastic chamber would, for example, be conceivable in this configuration, it being possible, in particular, to place the stopper on a vessel containing the PET tracer. The valve can then be used to fill the chamber without a user coming into contact with the PET tracer, for example. The rubber stopper in this case also forms the basis for firm fixing inside the holder.

It is likewise conceivable for the vessel containing the PET tracer to have a protruding tube stub or the like that can be introduced into the tubular section and opens the valve such that it is then possible, for example, to introduce PET tracer into the chamber by compressing the PET tracer vessel. The valve is closed upon extraction of the vessel, and an outflow is prevented.

A further embodiment of the present invention provides that the receptacle comprises a tube that can be filled with PET tracer via a suction mechanism. Here, the PET tracer is sucked out of the vessel containing the PET tracer and into the receptacle, for example in the manner of a pipette or syringe. Here, in turn, it is advantageously neither necessary nor possible for the user to touch the PET tracer.

The suction mechanism is simply operated, whereupon the receptacle is filled with PET tracer and the receptacle is inserted into the holder. The suction mechanism can advantageously comprise a compressible balloon or a suction piston moving in the tube. The tube is then simply introduced into the PET tracer, and the balloon is pressed or the suction piston is moved such that the PET tracer is sucked up by the suction mechanism.

In a further configuration, the receptacle can also be a container. It is possible here to think, in particular, of a small bottle that is filled with the PET tracer, closed and then introduced into the holder.

It is possible to conceive the device as, for example, a magnetic resonance phantom that in each case is introduced for calibration at a specific location into the patient receptacle of the magnetic resonance apparatus. Such magnetic resonance phantoms are known in principle. The elliptical water phantoms already mentioned may be named here as an example. Located thereon in addition according to the invention are now the holders that are filled with the receptacles with PET tracer.

In a particularly advantageous embodiment, the device can, however, also be a local coil, in particular a head coil. In the context of magnetic resonance imaging, such a local coil comprises visible markers and corresponding holders for the receptacles containing PET tracer. It is particularly advantageous here that there is no need for any further device such as a magnetic resonance phantom.

The calibration can, in particular, also be performed in this case simultaneously with the recording of the actual image data records of the target volume, since the markers and PET tracer can also be immediately visible in these image data records. For example, when examining a patient it is then necessary to apply the PET tracer no more than once. A portion of the PET tracer produced is transferred into the receptacle, while another portion is, for example, injected into the patient. The recordings are then carried out, it firstly being possible to use the positions that can be established in the images to calibrate the coordinate systems that can then be applied, in particular, immediately to the image data records obtained.

Furthermore, at least one embodiment of the invention also relates to a method for calibrating a magnetic resonance apparatus having a PET function by using the device according to at least one embodiment of the invention, comprising:

introducing a tracer into the at least one receptacle, placing the receptacle in the at least one holder of the device, introducing the device into the magnetic resonance apparatus, recording at least one magnetic resonance image data record showing the region of the device and at least one PET image data record showing the region of the device, determining the position and, if appropriate, orientation of the marker and of the tracer from the image data records, and determining a relationship of the coordinate systems of the image data records with the aid of the known relative spatial arrangement of the marker and of the tracer.

It is sensible here to determine the orientation of the marker and the tracer only when the marker and the PET tracer accommodated in the receptacle already exhibit an extended suitable shape that makes such a determination of orientation appear sensible in the course of determining the relationship of the coordinate systems. A three-dimensional registration of the two coordinate systems is also possible when use is made, for example, of three markers and three receptacles, having PET tracers, in the associated holders. Also conceivable is the use of an extended marker, suitable for determining orientation, in combination with three receptacles having PET tracers.

BRIEF DESCRIPTION OF THE DRAWINGS

Further advantages and details of the present invention emerge from the example embodiments described below, and via the drawings, in which.

DETAILED DESCRIPTION OF THE EXAMPLE EMBODIMENTS

Figure 1A:
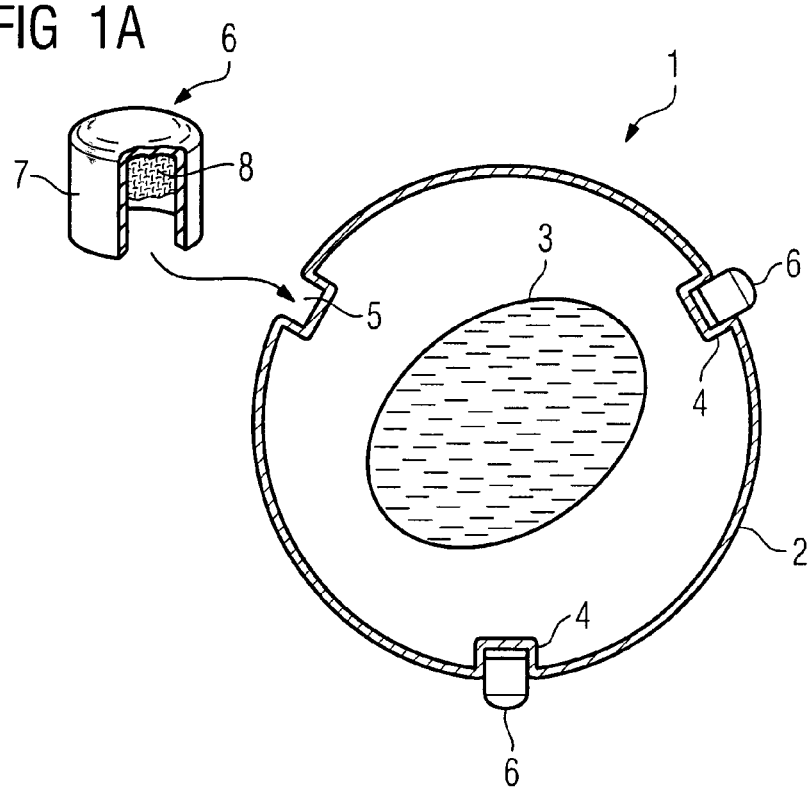
FIG. 1A shows a device, designed as a magnetic resonance phantom, in accordance with the first example embodiment of the present invention.

The terminology used herein is for the purpose of describing particular embodiments only and is not intended to be limiting of the present invention. As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Referencing the drawings, wherein like reference numerals designate identical or corresponding parts throughout the several views, example embodiments of the present patent application are hereafter described. Like numbers refer to like elements throughout. As used herein, the terms "and/or" and "at least one of" include any and all combinations of one or more of the associated listed items.

FIG. 1A shows a device 1 for calibrating a magnetic resonance apparatus having a PET function in accordance with a first example embodiment that is designed here as a magnetic resonance phantom 2. It includes a marker 3, here an extended region filled with water, that is visible through magnetic resonance imaging and fixed with respect to the device 1. However, it is also conceivable to provide a number of markers inside the magnetic resonance phantom. Furthermore, the device 1 includes holes 4 that are designed as depressions 5 of the type of a blind hole. Each of the holders 4 is assigned a receptacle 6. The receptacles 6 and the holders 4 are all of similar design such that each receptacle 6 can be inserted into each holder 4.

The receptacles 6 are designed to be filled with a PET tracer during a calibration operation. To this end, each receptacle 6 in this example comprises a cap-type housing 7 in which a liquid absorbing material 8, here cotton wool, is arranged in a fixed fashion, for example bonded in.

Figure 1B:
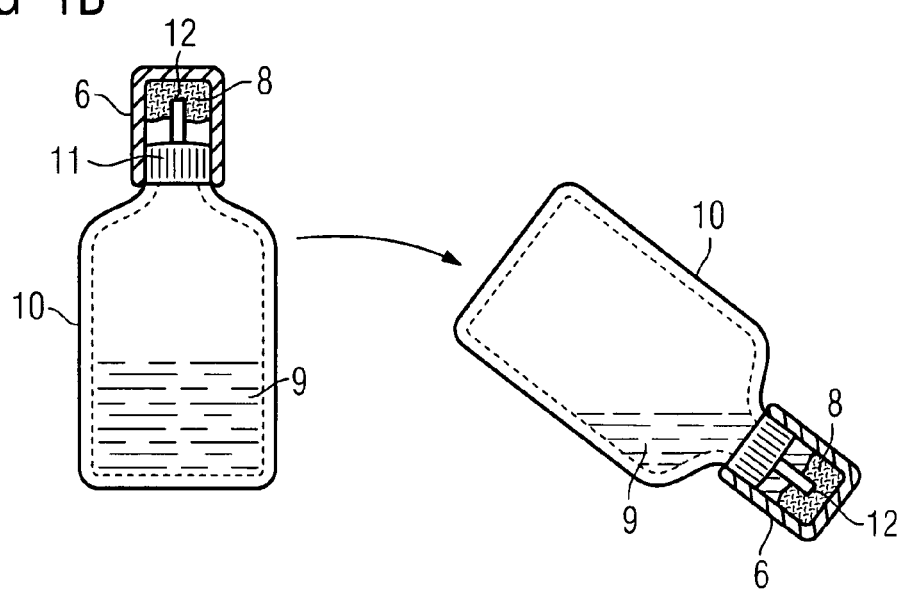
FIG. 1B shows the filling of a receptacle of the first example embodiment.

The filling of the receptacles 6 is illustrated in more detail in FIG. 1B. The bottle 10 containing the PET tracer 9 is provided with a seal 11 through which the PET tracer 9 can be removed by way of a narrower opening 12. Clearly, the receptacles 6 are adapted in size to the seal 11 of the bottle 10 such that they can be mounted there in a sealing fashion, in particular. To this end, the housing 7 can consist, in particular, of rubber. The opening 12 protrudes in this case into the material 8. If the bottle 10 is now tilted, PET tracer 9 penetrates through the opening 12 into the material 8 that correspondingly provides full suction. Consequently, PET tracer 9 is now contained in the receptacle 6, which can be inserted into the holder 4 in order to carry out the calibration.

Figure 2A:
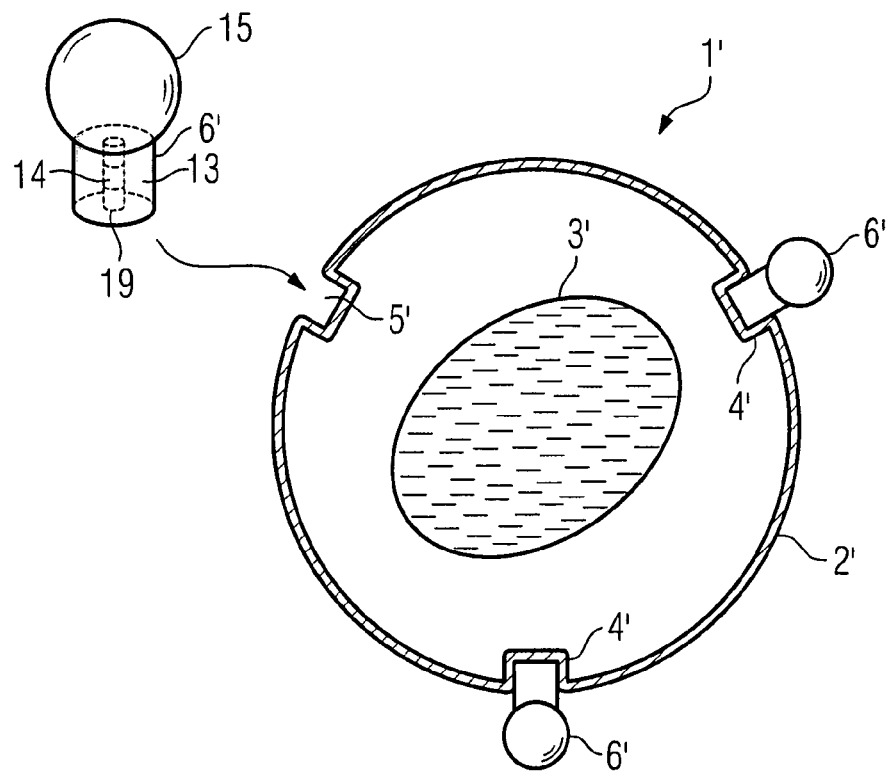
FIG. 2A shows a device, designed as a magnetic resonance phantom, in accordance with a second example embodiment of the present invention.

FIG. 2A shows a second example embodiment of a device 1', which is, in turn, designed as a magnetic resonance phantom 2'. Contained here as well, is a marker 3' that is filled with water. The holders 4' are, in turn, formed by depressions 5' of the type of a blind hole and into which receptacles 6' are inserted.

The receptacle 6' likewise illustrated in FIG. 2A comprises a lower section 13 that is tubular and in which a valve 14 is arranged. Adjoining the tubular section 13 is a balloon type elastic chamber 15 into which the PET tracer can be introduced and that can extend in accordance with the quantity of PET tracer contained therein.

Figure 2B:
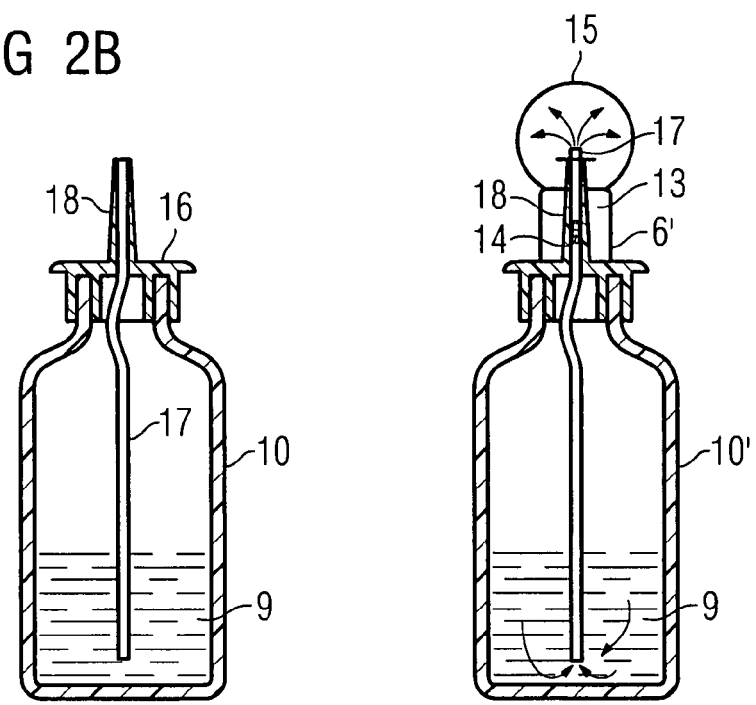
FIG. 2B shows the filling of a receptacle of the second example embodiment.

The tubular section 13 can, for example, be designed as a rubber drop that can be mounted directly on a bottle containing the PET tracer or on some other vessel, the PET tracer being pressed into the chamber 15 directly by the valve. Another type of filling of the receptacle 6' is illustrated in FIG. 2B. Shown there in the left-hand area of the image is a bottle 10' containing the PET tracer 9 and which is compressible. Mounted in a sealing fashion on this bottle is an attachment 16 that comprises a flexible tube 17 that reaches to the bottom of the bottle 10' and protrudes from the attachment 16 at the top. By pressing the bottle 10', it is possible to press PET tracer 9 out of the flexible tube 17 at the top.

The flexible tube 17 is, in addition, guided in a dimensionally stable guide section 18 of the attachment. The through opening 19, comprising the valve 14 of the receptacle 6' is now adapted to the size of the section 18 such that the receptacle 6' can be plugged onto the attachment 16 without any problem, as is illustrated in the right-hand part of FIG. 2B. The valve 14 is opened by pushing through the flexible tube 17 and the section 18 such that the flexible tube 17 protrudes into the chamber 15. As illustrated by the arrows in the right-hand part of FIG. 2B, PET tracer 9 can be pressed into the chamber 15 by producing a suitable pressure in the bottle 10'.

The filled receptacle 6' is then inserted, in turn, into the holder 4', whereupon imaging can be performed during the course of calibration when the magnetic resonance phantom 2' is introduced into the magnetic resonance apparatus.

Figure 3A:
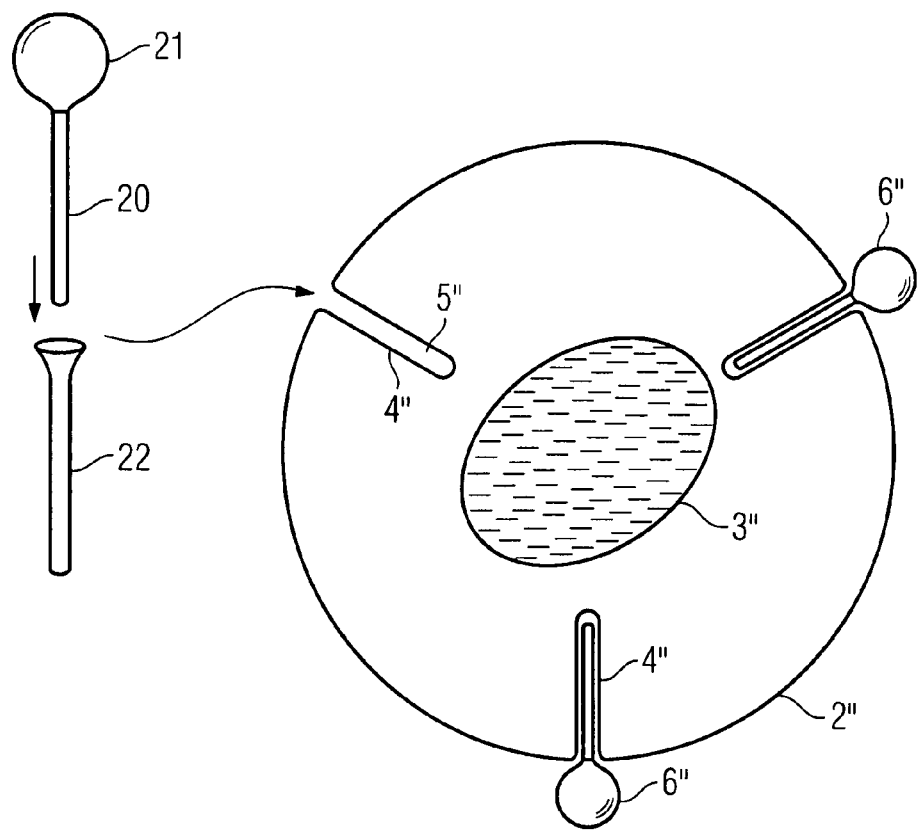
FIG. 3A shows a device, designed as a magnetic resonance phantom, in accordance with a third example embodiment of the present invention.

A further, third example embodiment of the present invention is shown in FIG. 3A. Illustrated there, in turn, is a device 1'' designed as a magnetic resonance phantom 2''. It comprises, in turn, a marker 3'' visible in magnetic resonance imaging, a space filled with water. Likewise provided are holders 4'', designed in turn as depressions 5'' of the type of a blind hole, and which serve to hold the receptacles 6''.

The receptacles 6'' are designed in the manner of a pipette and comprise a thin tube 20 at whose end a compressible balloon 21 is arranged. By pressing and subsequently releasing the balloon 21, an underpressure is produced in the tube 20 and the balloon 21 such that a suction effect results. A suction mechanism is thereby formed. With the aid of the pipette like design of the thin tube 20 and the balloon 21, it is possible, for example, to suck PET tracer into the tube 20 from a bottle containing the PET tracer or from another vessel containing the PET tracer.

Since the tube 21 is easy to break, there is further provided a cap 22 into which, as is indicated by the arrow 23, it is possible to plug the tube 20 with the balloon 21 for protective purposes. The complete receptacle 6'', that is to say tube 20 and balloon 21 in cap 22, can then be inserted into the holder 4'' as normal.

Figure 3B:
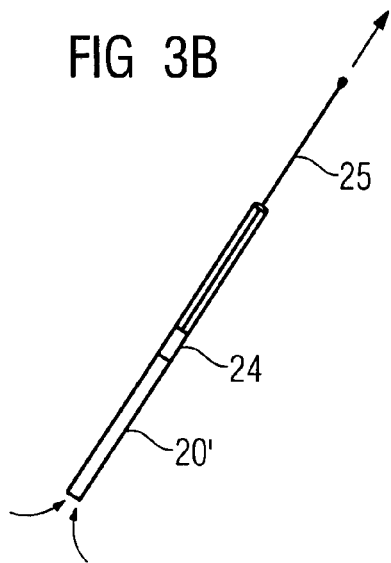
FIG. 3B shows an alternative configuration of a suction mechanism in the case of the receptacle of the third example embodiment.

An alternative configuration of a receptacle with a suction mechanism is illustrated in FIG. 3B. There, a moving suction piston 24 that can be moved, for example, via a pull 25 in order to suck up PET tracer is guided in a thin tube 20'.

Although the example embodiments named so far are all designed as magnetic resonance phantom with only one marker, it is nevertheless also conceivable to design a local coil such that the receptacle shown can be inserted there into corresponding holders. In addition, it is, of course, also conceivable to provide a number of markers visible through magnetic resonance imaging.

Figure 4:
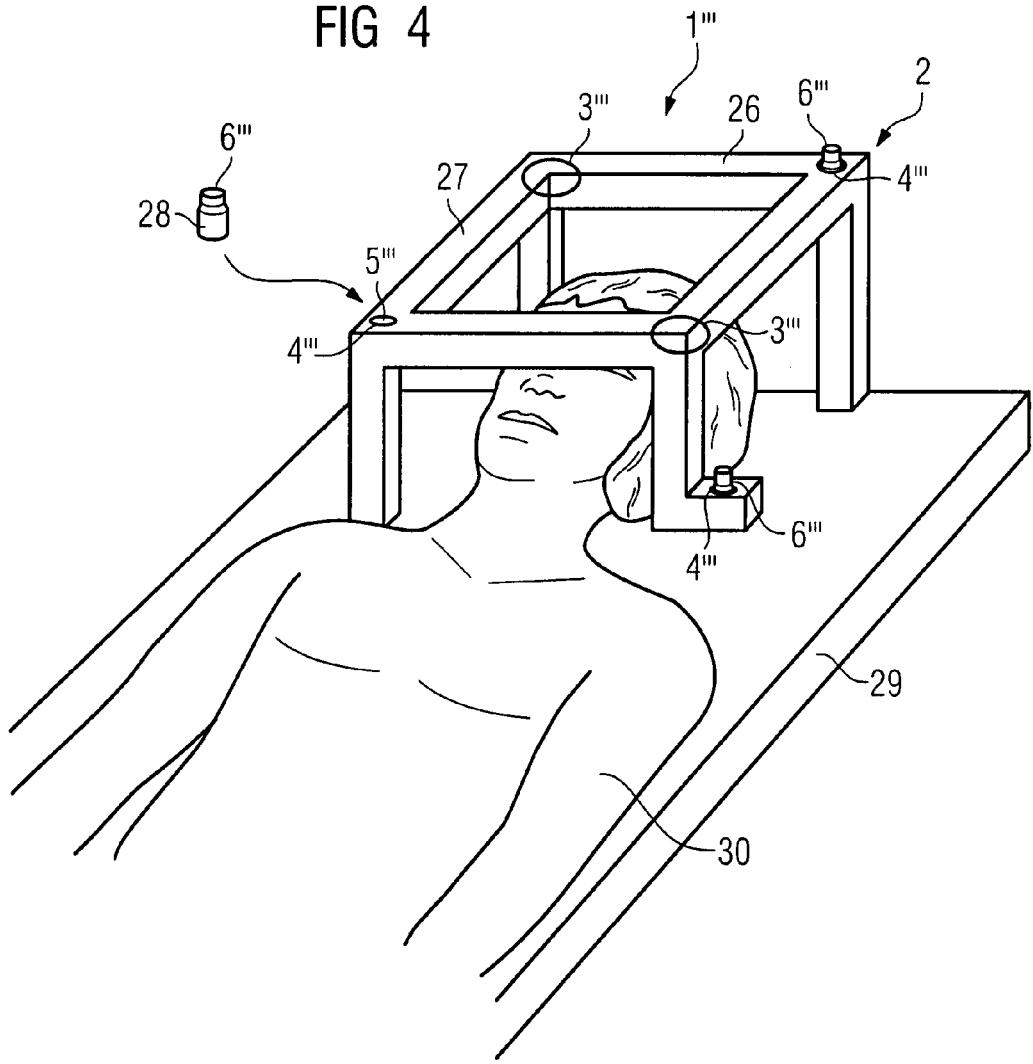
FIG. 4 shows a device, designed as a head coil, in accordance with a fourth example embodiment of the present invention.

An inventive device 1''', designed as a head coil 26, in accordance with a fourth example embodiment is shown in FIG. 4. The head coil comprises three different markers 3''' that are visible through magnetic resonance imaging and are introduced into the housing 27 of the head coil 26, thus being rendered fixed. Also provided in the housing 27 are three holders 4''' that are designed as depressions 5''' of the type of a blind hole. The receptacles 6''', which in this case are designed as simple containers 28, can be inserted into said depressions in order to hold a PET tracer. In the example, the head coil 26 is already installed on a patient couch 29 on which a patient 30 is located. Such an arrangement can be used to record image data records of the target examination volume in which the positions of the markers 3''' and of the PET tracer, that is to say of the receptacle 6''' inserted into the holder 4''' can be determined at the same time such that it is also possible to calibrate without previously introducing a phantom.

of course, the depressions 5''' can also be designed such that they can hold one of the receptacles 6, 6' and 6''.

Figure 5:
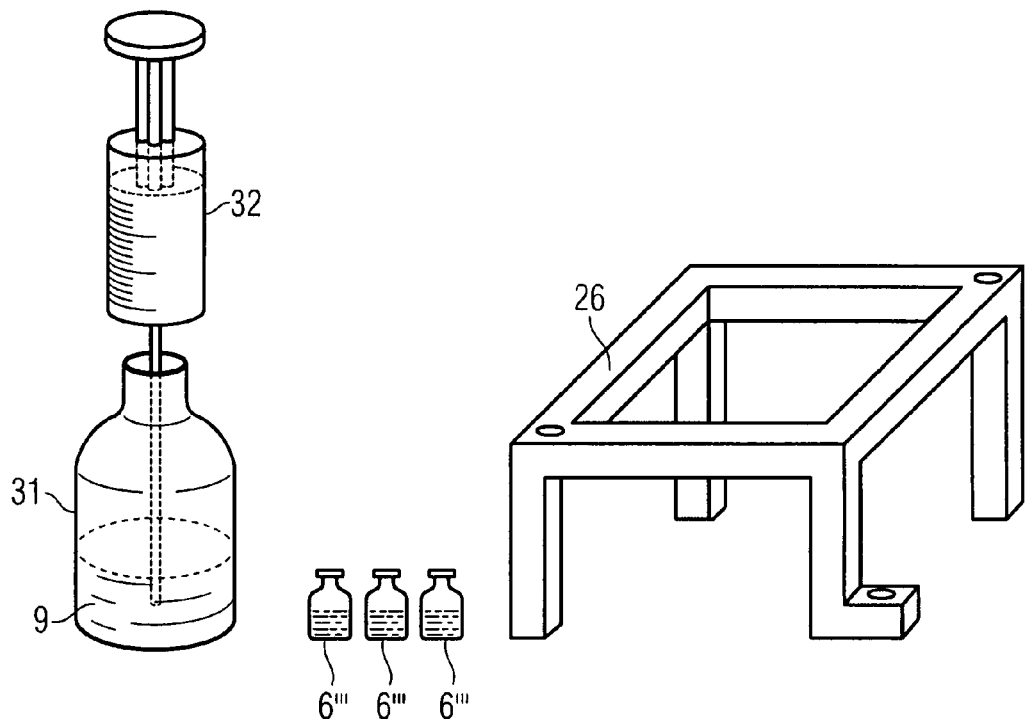
FIG. 5 shows preparations for imaging together with simultaneous calibration in the case of a device designed as a head coil.
Figure 5:
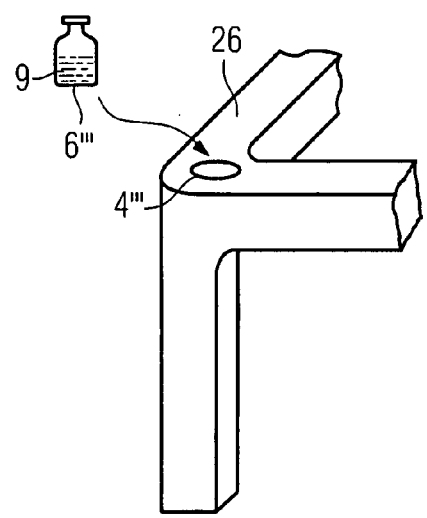

FIG. 5 shows the preparations for imaging by the head coil 26. Firstly, the PET tracer 9 is produced and introduced into a vessel 31. The injection 32 to be applied to the patient is then filled from this vessel 31, it being possible therefrom, moreover, to fill the receptacles, here the receptacles 6''', by way of example. While the patient 30 receives the injection 32, the receptacles 6''' with the tracer 9 are introduced into the holders 4'''. As also in the case of the other exemplary embodiments, the holders 4''' and the receptacles 6''' are all of identical design here. It is thus possible to perform the imaging and the calibration.

Although it was in each case always three holders and receptacles that were provided in said exemplary embodiments, it is, nonetheless, also conceivable to select a larger or smaller number, depending on accuracy and the role of the calibration operation. Thus, for example, one holder or receptacle is already sufficient in order merely to determine or check an offset. Two positions for PET tracers can be used to determine or check an offset and to check the slice position. Distortions can also be taken into account in a simple way when use is made of six or even eight positions for PET tracers.

Although only depressions of the type of a blind hole have been named here as holders in said exemplary embodiments, other types of holders are, however, also conceivable, for example clamping or plugging holders that are screwed on, glued on or welded on.

Figure 6:
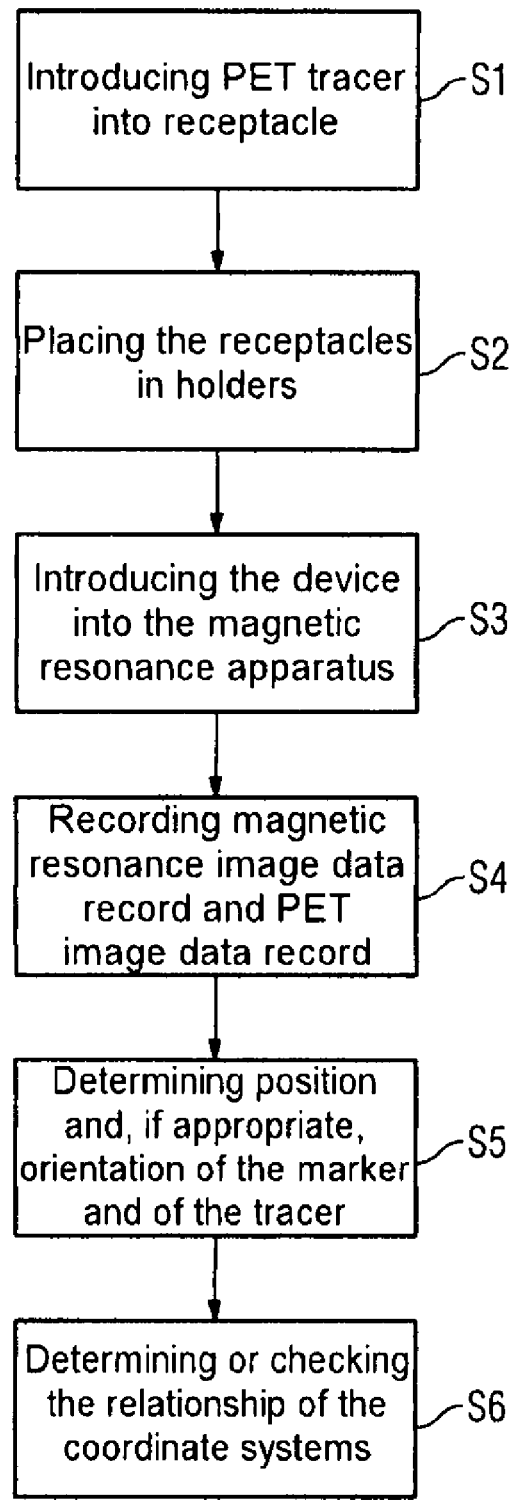
FIG. 6 shows a flowchart of the method according to an example embodiment of the invention.

Finally, FIG. 6 shows a flowchart of an example embodiment of the inventive method for calibrating a magnetic resonance apparatus having a PET function by using an inventive device for calibrating a magnetic resonance apparatus having a PET function.

To this end, a PET tracer is firstly introduced in step S1 into the one or the several receptacles. This can be done, for example, in the ways named in FIGS. 1B and 2B, but also by simply decanting or by suction into a receptacle in accordance with the third example embodiment.

Hereafter, the one or the several receptacles are placed in the appropriate holders of the device. This is done in step S2.

If the device has not already been introduced into the magnetic resonance apparatus, or is, in the case of a local coil, even already located in the latter, the device must now be introduced into the magnetic resonance apparatus in step S3. At least one magnetic resonance image data record and at least one PET image data record can now be recorded in step S4. It is to be borne in mind in this case that the device is located inside the recording region together with the markers or PET tracers positioned on it. The pictures undertaken here can also, if appropriate, already be pictures showing the examination zone, for example when the device is a local coil. In step S5, the position and, if appropriate, orientation of the marker and of the tracer are now determined from the image data records, whereupon a relationship of the coordinate systems of the image data records is determined in step S6 with the aid of the known relative spatial arrangement of the marker and the tracer.

The way in which two coordinate systems are registered with one another when reference points are present in two image data records, and the way in which a transformation of the coordinates from one coordinate system into the other coordinate system is determined in such a case are generally known and are not to be discussed here in more detail. When the relationship between the coordinate systems is already known, it is also possible in step S6 merely to check the already known relationship by checking whether the image data records reproduce the expected relationship.

However, in both embodiments it is important in step S6 that the fixed geometric relationships, that is to say the position of the markers and of the PET tracers, in particular, are known both among one another and between PET tracer and marker, and are also taken into account in the calculation taking place here as input values. However, this is possible without any problem owing to the fixedly positioned holders of the inventive device.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program and computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a computer readable media and is adapted to perform any one of the aforementioned methods when run on a computer device (a device including a processor). Thus, the storage medium or computer readable medium, is adapted to store information and is adapted to interact with a data processing facility or computer device to perform the method of any of the above mentioned embodiments.

The storage medium may be a built-in medium installed inside a computer device main body or a removable medium arranged so that it can be separated from the computer device main body. Examples of the built-in medium include, but are not limited to, rewriteable non-volatile memories, such as ROMs and flash memories, and hard disks. Examples of the removable medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A device for calibrating a magnetic resonance apparatus including a PET function, comprising:
    at least one marker that is visible through magnetic resonance imaging and fixed with reference to the device;
    at least one holder fixed with reference to the marker, the at least one holder being configured to hold a receptacle; and
    at least one receptacle configured to hold a PET tracer, the PET tracer generating a PET signal during PET imaging; wherein
    the at least one receptacle is removably fixed in the at least one holder.

2. The device as claimed in claim 1, wherein the at least one holder includes two or more holders and wherein the at least one receptacle includes two or more receptacles.

3. The device as claimed in claim 2, wherein the at least one receptacle comprises a housing that is filled at least partially with liquid absorbing material.

4. The device as claimed in claim 2, wherein the at least one receptacle comprises a tubular section that is suitable for connecting to a vessel containing the PET tracer and has a valve arranged therein.

5. The device as claimed in claim 2, wherein the device is configured as a magnetic resonance phantom.

6. The device as claimed in claim 2, wherein the device is a local coil.

7. The device as claimed in claim 1, wherein the at least one holder comprises a depression on the device in which the receptacle is held.

8. The device as claimed in claim 7, wherein the depression is of the type of a blind hole.

9. The device as claimed in claim 7, wherein the at least one holder comprises a depression on the device in which the receptacle is held by being plugged or clamped.

10. The device as claimed in claim 1, wherein the at least one receptacle comprises a housing that is filled at least partially with liquid absorbing material.

11. The device as claimed in claim 1, wherein the at least one receptacle comprises a tubular section that is suitable for connecting to a vessel containing the PET tracer and has a valve arranged therein.

12. The device as claimed in claim 11, wherein the at least one receptacle comprises a balloon type, elastic chamber that is adjacent to the tubular section and is designed to enlarge its volume upon the introduction of PET tracer at least one of via the tubular section and via a line running through the tubular section.

13. The device as claimed in claim 1, wherein the at least one receptacle comprises a tube that is fillable with PET tracer via a suction mechanism.

14. The device as claimed in claim 13, wherein the suction mechanism comprises at least one of a compressible balloon and a suction piston moving in the tube.

15. The device as claimed in claim 1, wherein the at least one receptacle is a container.

16. The device as claimed in claim 1, wherein the device is configured as a magnetic resonance phantom.

17. The device as claimed in claim 1, wherein the device is a local coil.

18. The device as claimed in claim 1, wherein the local coil is a head coil.

19. A method for calibrating a magnetic resonance apparatus having a PET function by using a device, comprising:
   introducing a tracer into at least one receptacle of the device;
   placing the at least one receptacle in at least one holder of the device;
   introducing the device into the magnetic resonance apparatus;
   recording at least one magnetic resonance image data record showing a region of the device and at least one PET image data record showing the region of the device;
   determining a position and, if appropriate, orientation of at least one marker of the device, that is visible through magnetic resonance imaging and fixed with reference to the device, and of the tracer from the image data records; and
   determining a relationship between coordinate systems of the image data records with aid of known relative spatial arrangement of the marker and of the tracer.

20. A computer readable medium including program segments for, when executed on a computer device, causing the computer device to implement the method of claim 19.

* * * * *